(12) United States Patent
Pan et al.

(10) Patent No.: US 11,843,336 B2
(45) Date of Patent: Dec. 12, 2023

(54) CIRCUIT FOR SHIFTING FIXED GROUND LEVEL TO FLOATING GROUND LEVEL IN MOTOR DRIVE SYSTEM

(71) Applicant: Hefei Aichuangwei Electronic Technology Co., Ltd., Hefei (CN)

(72) Inventors: Jun Pan, Hefei (CN); Lixiang Xu, Hefei (CN); Lixiang Wen, Hefei (CN); Lei Qiu, Hefei (CN); Dianwu Li, Hefei (CN); Wei Wang, Hefei (CN); Lei Han, Hefei (CN); Ke Wang, Hefei (CN)

(73) Assignee: Hefei Aichuangwei Electronic Technology Co., Ltd., Hefei (CN)

( * ) Notice: Subject to any disclaimer, the term of this patent is extended or adjusted under 35 U.S.C. 154(b) by 107 days.

(21) Appl. No.: 17/552,554

(22) Filed: Dec. 16, 2021

(65) Prior Publication Data

US 2023/0126827 A1   Apr. 27, 2023

(30) Foreign Application Priority Data

Oct. 22, 2021   (CN) .......................... 202111234469.8

(51) Int. Cl.
*H01L 27/02* (2006.01)
*H02P 25/16* (2006.01)

(52) U.S. Cl.
CPC .............. *H02P 25/16* (2013.01); *H01L 27/02* (2013.01)

(58) Field of Classification Search
CPC ....................................................... H01L 27/02
USPC .......................................................... 327/333
See application file for complete search history.

(56) References Cited

U.S. PATENT DOCUMENTS

2016/0191027 A1*   6/2016   Qiu .................. H03K 3/356113
327/333

* cited by examiner

*Primary Examiner* — Tomi Skibinski
(74) *Attorney, Agent, or Firm* — Kirk A. Wilson; Joseph T. Guy; Patent Filing Specialist Inc.

(57) ABSTRACT

Disclosed is a circuit for shifting a fixed ground level to a floating ground level in a motor drive system, including a floating ground high level line, a floating ground output level line, a floating ground low level line, a normal input level line, and a normal ground line that are used for characterizing an application detail. The circuit includes a controlled switching current source, a first upper current rectifier, a second upper current rectifier, a lower current rectifier, and an amplifying and shaping circuit that are integrated on a same substrate.

7 Claims, 2 Drawing Sheets

CIRCUIT FOR SHIFTING FIXED GROUND LEVEL TO FLOATING GROUND LEVEL IN MOTOR DRIVE SYSTEM

CROSS REFERENCE TO RELATED APPLICATION

This patent application claims the benefit and priority of Chinese Patent Application No. 202111234469.8, filed on Oct. 22, 2021, the disclosure of which is incorporated by reference herein in its entirety as part of the present application.

TECHNICAL FIELD

The present disclosure relates to the field of semiconductor integrated circuit design technologies, and in particular, to a circuit for shifting a fixed ground level to a floating ground level in a motor drive system.

BACKGROUND ART

In the design of various composite drive systems, a reference ground of each unit signal source is not the same. Especially in the field of motor drive system design, there are typically two types of reference ground lines, which are respectively a normal ground line and a floating ground low level line. Thus, a reasonable level shift circuit is needed between the units, to communicate signals having different reference ground levels, thereby satisfying actual circuit requirements.

SUMMARY

An objective of the present disclosure is to provide a circuit for shifting a fixed ground level to a floating ground level in a motor drive system, aiming to solve the problem described in the background art.

To achieve the above objective, the present disclosure uses the following technical solutions.

A circuit for shifting a fixed ground level to a floating ground level in a motor drive system, including a floating ground high level line, a floating ground output level line, a floating ground low level line, a normal input level line, and the normal ground line that are used for characterizing an application detail. The circuit includes a controlled switching current source, a first upper current rectifier, a second upper current rectifier, a lower current rectifier, and an amplifying and shaping circuit, which are integrated on a same substrate. A fixed ground level is inputted to the controlled switching current source with the normal ground line as a zero-level reference ground, and a floating ground level in the same phase with the fixed ground level is outputted after the fixed ground level is subjected to shifting and conversion by the first upper current rectifier, the second upper current rectifier, the lower current rectifier, and the amplifying and shaping circuit.

Further, the controlled switching current source is provided with two input terminals and two output terminals. A first input terminal is externally connected to the normal input level line, a second input terminal is externally connected to the normal ground line, and a first output terminal and a second output terminal are configured to output currents I1 and I2 respectively. A power supply terminal of the first upper current rectifier is externally connected to the floating ground high level line, an input terminal of the first upper current rectifier is connected to the current I1, and an output terminal of the first upper current rectifier is configured to output a current I3. A power supply terminal of the second upper current rectifier is externally connected to the floating ground high level line, an input terminal of the second upper current rectifier is connected to the current I2, and an output terminal of the second upper current rectifier is configured to output a current I4. A power supply terminal of the lower current rectifier is externally connected to the floating ground low level line, an input terminal of the lower current rectifier is connected to the current I3, and an output terminal of the lower current rectifier is to output a current I5. The amplifying and shaping circuit is provided with two power supply terminals, which are respectively externally connected to the floating ground high level line and the floating ground low level line. An input terminal of the amplifying and shaping circuit is connected to a current I6, a magnitude of the current I6 being a difference between the current I4 and the current I5; and an output terminal of the amplifying and shaping circuit is configured to output the floating ground level in the same phase with the input fixed level of the controlled switching current source, and is externally connected to the floating ground output level line.

Further, the controlled switching current source includes a bias voltage source VBIAS, and metal-oxide semiconductor (MOS) transistors M1, M2, and M3. A positive electrode of the bias voltage source VBIAS is connected to a gate of the MOS transistor M1, and a negative electrode of the bias voltage source VBIAS is connected to a source of the MOS transistor M1 and then connected to the normal ground line. A drain of the MOS transistor M1 is connected to a source of the MOS transistor M2 and a drain of the MOS transistor M3, respectively. Gates of the MOS transistors M2 and M3 are interconnected and connected to the normal input level line. A drain of the MOS transistor M2 is configured to output the current I1. A source of the MOS transistor M3 is configured to output the current I2.

Further, the first upper current rectifier includes MOS transistors M4 and M5. A drain of the MOS transistor M4 is connected to the current I1. A gate of the MOS transistor M4 and a drain of the MOS transistor M4 are interconnected and connected to a gate of the MOS transistor M5. Sources of the MOS transistors M4 and M5 are interconnected and connected to the floating ground high level line. A drain of the MOS transistor M5 is configured to output the current I3.

Further, the second upper current rectifier includes MOS transistors M6 and M7. A drain of the MOS transistor M6 is connected to the current I2. A gate of the MOS transistor M6 and a drain of the MOS transistor M6 are interconnected and connected to a gate of the MOS transistor M7. Sources of the MOS transistors M6 and M7 are interconnected and connected to the floating ground high level line. A drain of the MOS transistor M7 is configured to output the current I4.

Further, the lower current rectifier includes MOS transistors M8 and M9. A drain of the MOS transistor M8 is connected to the current I3. A gate of the MOS transistor M8 and a drain of the MOS transistor M8 are interconnected and connected to a gate of the MOS transistor M9. Sources of the MOS transistors M8 and M9 are interconnected and connected to the floating ground low level line. A drain of the MOS transistor M9 is configured to output the current I5.

Further, the amplifying and shaping circuit includes MOS transistors M10 and M11. Gates of the MOS transistors M10 and M11 are interconnected and connected to the currents I4 and I5. Drains of the MOS transistors M10 and M11 are interconnected and connected to the floating ground output level line. A source of the MOS transistor M10 is connected to the floating ground high level line. A source of the MOS transistor M11 is connected to the floating ground low level line.

In can be seen that the present disclosure integrates the modules in a single chip. The fixed ground level is inputted to the controlled switching current source with the normal ground line as the zero-level reference ground. After the fixed ground level is subjected to shifting and conversion by the first upper current rectifier, the second upper current rectifier, the lower current rectifier, and the amplifying and shaping circuit, the floating ground level in the same phase with the fixed ground level is outputted. This realizes communication between the unit with the fixed zero-level reference ground and the unit with the floating zero-level reference ground in the motor drive system, thereby satisfying an application requirement of the motor drive.

In the figure: 1. Controlled switching current source; 2. First upper current rectifier; 3. Second upper current rectifier; 4. Lower current rectifier; and 5. Amplifying and shaping circuit.

DETAILED DESCRIPTION OF THE EMBODIMENTS

Embodiments of the present disclosure are described in detail below with reference to the accompanying drawings.

Figure 1:
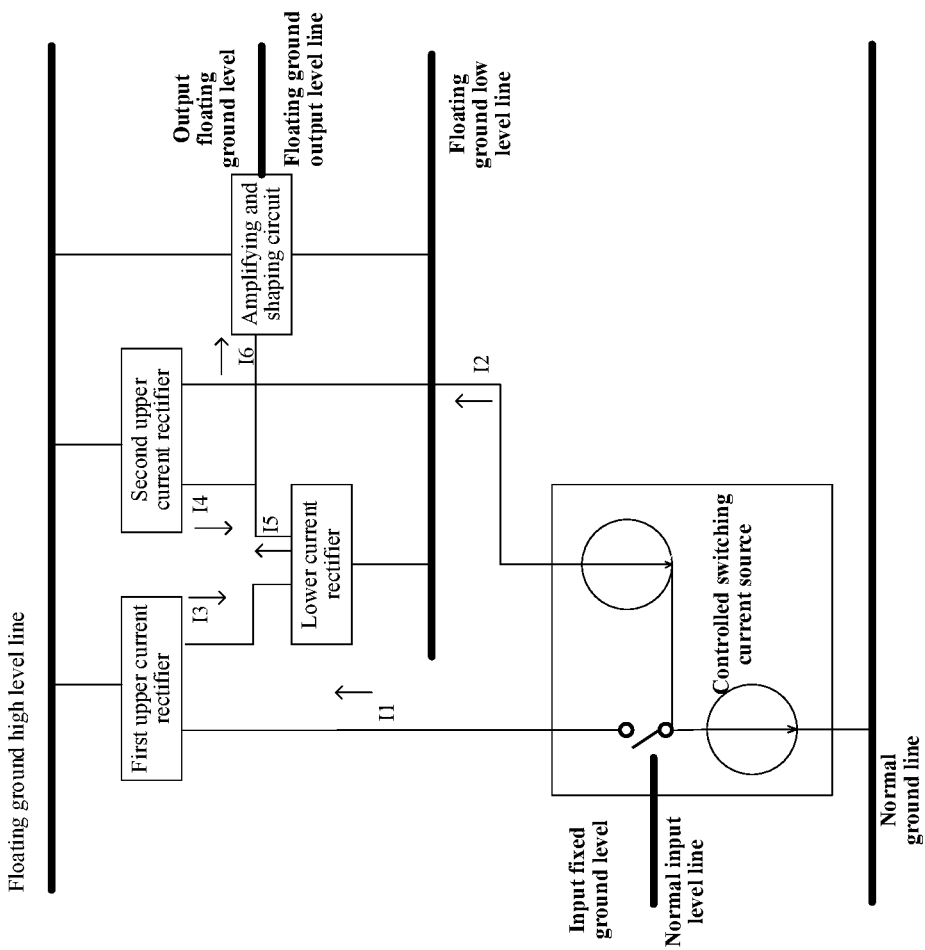
FIG. 1 is a schematic diagram showing module connection according to the present disclosure.

As shown in FIG. 1, a circuit for shifting a fixed ground level to a floating ground level in a motor drive system includes a controlled switching current source, a first upper current rectifier, a second upper current rectifier, a lower current rectifier, and an amplifying and shaping circuit, which are integrated on a same substrate. A fixed ground level is inputted to the controlled switching current source with a normal ground line as a zero-level reference ground. After the fixed ground level is subjected to shifting and conversion by the first upper current rectifier, the second upper current rectifier, the lower current rectifier, and the amplifying and shaping circuit, a floating ground level in the same phase with the fixed ground level is outputted. The present disclosure uses a floating ground high level line, a floating ground output level line, a floating ground low level line, a normal input level line, and the normal ground line to characterize an application detail. Specifically, the controlled switching current source is provided with two input terminals and two output terminals. A first input terminal is connected to the normal input level line, a second input terminal is connected to the normal ground line, and a first output terminal and a second output terminal output currents I1 and I2 respectively. A power supply terminal of the first upper current rectifier is externally connected to the floating ground high level line, an input terminal of the first upper current rectifier is connected to the current I1, and an output terminal of the first upper current rectifier outputs a current I3. A power supply terminal of the second upper current rectifier is externally connected to the floating ground high level line, an input terminal of the second upper current rectifier is connected to the current I2, and an output terminal of the second upper current rectifier outputs a current I4. A power supply terminal of the lower current rectifier is externally connected to the floating ground low level line, an input terminal of the lower current rectifier is connected to the current I3, and an output terminal of the lower current rectifier outputs a current I5. The amplifying and shaping circuit is provided with two power supply terminals, which are respectively connected to the floating ground high level line and the floating ground low level line, an input terminal of the amplifying and shaping circuit is connected to a current I6, a magnitude of the current I6 being a difference between the current I4 and the current I5; and an output terminal of the amplifying and shaping circuit outputs the floating ground level that is in the same phase with the input fixed level of the controlled switching current source, and is externally connected to the floating ground output level line.

Figure 2:
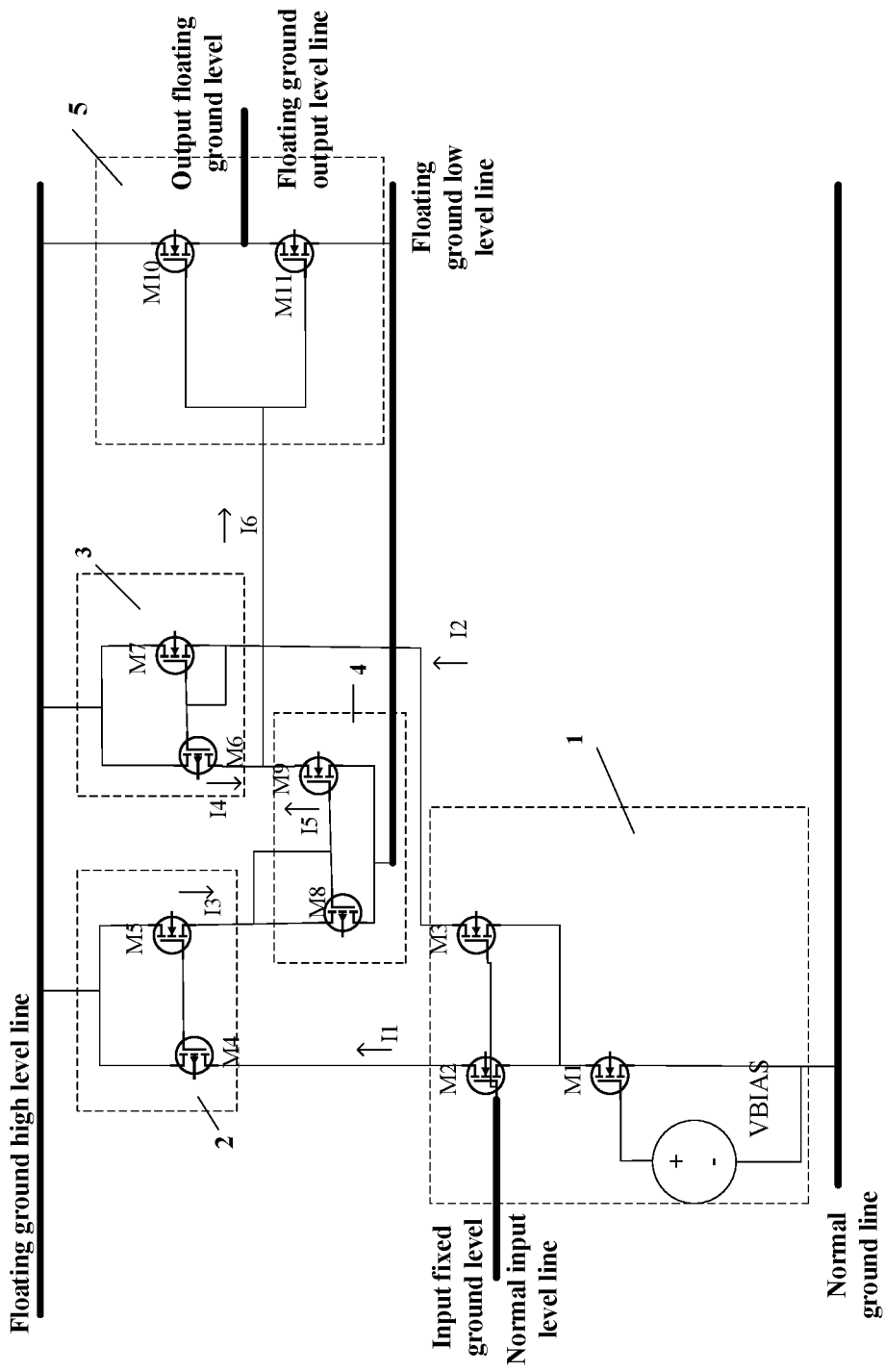
FIG. 2 is a schematic diagram showing electrical connection according to the present disclosure.

As shown in FIG. 2, during a specific use process:

In an embodiment, the controlled switching current source includes a bias voltage source VBIAS, and MOS transistors M1, M2, and M3. A positive electrode of the bias voltage source VBIAS is connected to a gate of the MOS transistor M1, and a negative electrode of the bias voltage source VBIAS is connected to a source of the MOS transistor M1 and then connected to the normal ground line. A drain of the MOS transistor M1 is connected to a source of the MOS transistor M2 and a drain of the MOS transistor M3 respectively. Gates of the MOS transistors M2 and M3 are interconnected and connected to the normal input level line. A drain of the MOS transistor M2 is used to output the current I1. A source of the MOS transistor M3 is used to output the current I2. With the normal ground line as a zero-level reference point, the input fixed ground level of the controlled switching current source may be an input fixed ground low level or an input fixed ground non-low level. In a case that the input fixed ground level is the input fixed ground low level, a relationship between the output currents of the controlled switching current source is characterized as "I1 is greater than I2". In a case that the input fixed ground level is the input fixed ground non-low level, the relationship between the output currents of the controlled switching current source is characterized as "I1 is less than I2".

In an embodiment, the first upper current rectifier includes MOS transistors M4 and M5. A drain of the MOS transistor M4 is connected to the current I1. A gate of the MOS transistor M4 and a drain of the MOS transistor M4 are interconnected and connected to a gate of the MOS transistor M5. Sources of the MOS transistors M4 and M5 are interconnected and connected to the floating ground high level line. A drain of the MOS transistor M5 is used to output the current I3. The power supply terminal of the first upper current rectifier is externally connected to the floating ground high level line, and the input terminal of the first upper current rectifier is connected to the current I1. After the current I1 is converted by the first upper current rectifier, the output terminal of the first upper current rectifier outputs the current I3. The value of the current I3 is equal to the value of the current I1.

In an embodiment, the second upper current rectifier includes MOS transistors M6 and M7. A drain of the MOS transistor M6 is connected to the current I2. A gate of the MOS transistor M6 and a drain of the MOS transistor M6 are interconnected and connected to a gate of the MOS transistor M7. Sources of the MOS transistors M6 and M7 are interconnected and connected to the floating ground high level line. A drain of the MOS transistor M7 is used to output the current I4. The power supply terminal of the second upper current rectifier is externally connected to the floating ground high level line, and the input terminal of the second upper current rectifier is connected to the current I2. After the current I2 is converted by the second upper current rectifier, the output terminal of the second upper current rectifier outputs the current I4. The value of the current I4 is equal to the value of the current I2.

In an embodiment, the lower current rectifier includes MOS transistors M8 and M9. A drain of the MOS transistor M8 is connected to the current I3. A gate of the MOS transistor M8 and a drain of the MOS transistor M8 are interconnected and connected to a gate of the MOS transistor M9. Sources of the MOS transistors M8 and M9 are interconnected and connected to the floating ground low level line. A drain of the MOS transistor M9 is used to output the current I5. The power supply terminal of the lower current rectifier is externally connected to the floating ground low level line, and the input terminal of the lower current rectifier is connected to the current I3. After the current I3 is converted by the lower current rectifier, the output terminal of the lower current rectifier outputs the current I5. The value of the current I5 is equal to the value of the current I3, namely being equal to the value of the current I1.

In an embodiment, the amplifying and shaping circuit includes MOS transistors M10 and M11. Gates of the MOS transistors M10 and M11 are interconnected and connected to the currents I4 and I5. Drains of the MOS transistors M10 and M11 are interconnected and connected to the floating ground output level line. A source of the MOS transistor M10 is connected to the floating ground high level line. A source of the MOS transistor M11 is connected to the floating ground low level line. The amplifying and shaping circuit are provided with two power supply terminals, which are respectively connected to the floating ground high level line and the floating ground low level line; and the input terminal of the amplifying and shaping circuit is connected to the current I6, the magnitude of the current I6 being the difference between the current I4 and the current I5, which, according to the foregoing relationships between the relevant current values, may also be described as the difference between the current I1 and the current I2 outputted by the controlled switching current source. Positive and negative attributes of the current I6 characterize different relationships between the two currents outputted by the controlled switching current sources, further characterizing different types of the input fixed ground level of the controlled switching current source.

In a case that the input current I6 of the amplifying and shaping circuit has the negative attribute, namely corresponding to the situation that the relationship between the two output currents of the controlled switching current source is "I1 is greater than I2", it indicates that the input fixed ground level of the controlled switching current source is the input fixed ground low level.

In a case that the input current I6 of the amplifying and shaping circuit has the positive attribute, namely corresponding to the situation that the relationship between the two output currents of the controlled switching current source is "I1 is less than I2", it indicates that the input fixed ground level of the controlled switching current source is the input fixed ground non-low level.

Specifically, the floating ground low level line is used as its zero-level reference ground. When the input current I6 of the amplifying and shaping circuit has the negative attribute, the output floating ground level of the amplifying and shaping circuit is a floating ground low level line voltage; and when the input current I6 of the amplifying and shaping circuit has the positive attribute, the output floating ground level of the amplifying and shaping circuit is a floating ground high level line voltage, which realizes the in-phase relationship. In addition, the output floating ground level of the amplifying and shaping circuit is externally connected to the floating ground output level line, thus accomplishing the shifting and conversion of the input fixed ground level with the normal ground line as its zero-level reference ground to the output floating ground level that is in the same phase with the input fixed ground level. This realizes communication between the unit with the fixed zero-level reference ground and the unit with the floating zero-level reference ground in the motor drive system, thereby satisfying an application requirement of the motor drive.

The above embodiments are merely intended to describe the preferred embodiments of the present disclosure rather than to limit the scope of the present disclosure. Various alterations and improvements made by those of ordinary skill in the art based on the technical solution of the present disclosure without departing from the design spirit of the present disclosure shall fall within the protection scope of the claims of the present disclosure.

What is claimed is:

1. A circuit for shifting a fixed ground level to a floating ground level in a motor drive system, comprising a floating ground high level line, a floating ground output level line, a floating ground low level line, a normal input level line, and a normal ground line that are used for characterizing an application detail, and the circuit comprising a controlled switching current source, a first upper current rectifier, a second upper current rectifier, a lower current rectifier, and an amplifying and shaping circuit that are integrated on a same substrate; wherein a fixed ground level is inputted to the controlled switching current source with the normal ground line as a zero-level reference ground, and a floating ground level in the same phase with the fixed ground level is outputted after the fixed ground level is subjected to shifting and conversion by the first upper current rectifier, the second upper current rectifier, the lower current rectifier, and the amplifying and shaping circuit.

2. The circuit for shifting a fixed ground level to a floating ground level in a motor drive system according to claim 1, wherein the controlled switching current source is provided with two input terminals and two output terminals, a first input terminal is externally connected to the normal input level line, a second input terminal is externally connected to the normal ground line, and a first output terminal and a second output terminal are configured to output currents I1 and I2 respectively; a power supply terminal of the first upper current rectifier is externally connected to the floating ground high level line, an input terminal of the first upper current rectifier is connected to the current I1, and an output terminal of the first upper current rectifier is configured to output a current I3; a power supply terminal of the second upper current rectifier is externally connected to the floating ground high level line, an input terminal of the second upper current rectifier is connected to the current I2, and an output terminal of the second upper current rectifier is configured to output a current I4; a power supply terminal of the lower current rectifier is externally connected to the floating ground low level line, an input terminal of the lower current rectifier is connected to the current I3, and an output terminal of the lower current rectifier is to output a current I5; the amplifying and shaping circuit is provided with two power supply terminals, which are respectively externally connected to the floating ground high level line and the floating ground low level line, an input terminal of the amplifying and shaping circuit is connected to a current I6, a magnitude of the current I6 being a difference between the current I4 and the current I5, and an output terminal of the amplifying and shaping circuit is configured to output the floating ground level in the same phase with the input fixed level of the controlled switching current source, and is externally connected to the floating ground output level line.

3. The circuit for shifting a fixed ground level to a floating ground level in a motor drive system according to claim 1, wherein the controlled switching current source comprises a bias voltage source VBIAS, and metal-oxide semiconductor (MOS) transistors M1, M2, and M3; wherein a positive electrode of the bias voltage source VBIAS is connected to a gate of the MOS transistor M1, a negative electrode of the bias voltage source VBIAS is connected to a source of the MOS transistor M1 and then connected to the normal ground line, a drain of the MOS transistor M1 is connected to a source of the MOS transistor M2 and a drain of the MOS transistor M3 respectively, gates of the MOS transistors M2 and M3 are interconnected and connected to the normal input level line, a drain of the MOS transistor M2 is configured to output the current I1, and a source of the MOS transistor M3 is configured to output the current I2.

4. The circuit for shifting a fixed ground level to a floating ground level in a motor drive system according to claim 1, wherein the first upper current rectifier comprises MOS transistors M4 and M5; wherein a drain of the MOS transistor M4 is connected to the current I1, a gate of the MOS transistor M4 and a drain of the MOS transistor M4 are interconnected and connected to a gate of the MOS transistor M5, sources of the MOS transistors M4 and M5 are interconnected and connected to the floating ground high level line, and a drain of the MOS transistor M5 is configured to output the current I3.

5. The circuit for shifting a fixed ground level to a floating ground level in a motor drive system according to claim 1, wherein the second upper current rectifier comprises MOS transistors M6 and M7; wherein a drain of the MOS transistor M6 is connected to the current I2, a gate of the MOS transistor M6 and a drain of the MOS transistor M6 are interconnected and connected to a gate of the MOS transistor M7, sources of the MOS transistors M6 and M7 are interconnected and connected to the floating ground high level line, and a drain of the MOS transistor M7 is configured to output the current I4.

6. The circuit for shifting a fixed ground level to a floating ground level in a motor drive system according to claim 1, wherein the lower current rectifier comprises MOS transistors M8 and M9; wherein a drain of the MOS transistor M8 is connected to the current I3, a gate of the MOS transistor M8 and a drain of the MOS transistor M8 are interconnected and connected to a gate of the MOS transistor M9, sources of the MOS transistors M8 and M9 are interconnected and connected to the floating ground low level line, and a drain of the MOS transistor M9 is configured to output the current I5.

7. The circuit for shifting a fixed ground level to a floating ground level in a motor drive system according to claim 1, wherein the amplifying and shaping circuit comprises MOS transistors M10 and M11; wherein gates of the MOS transistors M10 and M11 are interconnected and connected to the currents I4 and I5, drains of the MOS transistors M10 and M11 are interconnected and connected to the floating ground output level line, a source of the MOS transistor M10 is connected to the floating ground high level line, and a source of the MOS transistor M11 is connected to the floating ground low level line.

* * * * *